(12) United States Patent
Takeuchi

(10) Patent No.: US 7,868,437 B2
(45) Date of Patent: Jan. 11, 2011

(54) MOUNTING STRUCTURE FOR IC TAG AND IC CHIP FOR MOUNTING

(75) Inventor: Shuichi Takeuchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 449 days.

(21) Appl. No.: 11/936,332

(22) Filed: Nov. 7, 2007

(65) Prior Publication Data
US 2008/0061417 A1    Mar. 13, 2008

Related U.S. Application Data

(63) Continuation of application No. PCT/JP2005/009417, filed on May 24, 2005.

(51) Int. Cl.
*H01L 23/02* (2006.01)
*H01L 23/20* (2006.01)

(52) U.S. Cl. ............... 257/679; 438/365; 438/378

(58) Field of Classification Search ............... 257/679; 438/365, 378
See application file for complete search history.

(56) References Cited

U.S. PATENT DOCUMENTS

| 6,181,001 | B1 * | 1/2001 | Ikefuji et al. ............... 257/679 |
| 2003/0102544 | A1 * | 6/2003 | Nishikawa ............... 257/678 |
| 2004/0219714 | A1 * | 11/2004 | Yagi et al. ............... 438/106 |

FOREIGN PATENT DOCUMENTS

| JP | 6252339 A | 9/1994 |
| JP | 200242089 A | 2/2002 |
| JP | 2000242753 A | 9/2002 |
| JP | 20036600 A | 1/2003 |
| JP | 2004362190 A | 12/2004 |

OTHER PUBLICATIONS

International Search Report of PCT/JP2005/009417, date of mailing Jul. 5, 2005.

* cited by examiner

*Primary Examiner*—Kenneth A Parker
*Assistant Examiner*—Joseph Nguyen
(74) *Attorney, Agent, or Firm*—Westerman, Hattori, Daniels & Adrian, LLP

(57) ABSTRACT

A mounting structure for an IC tag where an IC chip for mounting (10) is mounted so as to be electrically connected to antenna patterns (44a), (44b). The assembly process that mounts the IC chip for mounting (10) on the antenna patterns (44a), (44b) is simplified, which makes it possible to reduce the manufacturing cost of IC tags. The IC chip for mounting 10 is formed by winding conductive wires (12a), (12b) so as to encircle an outer surface of an IC chip (20) between two opposite edges of the IC chip (20) in a state where the conductive wires (12a), (12b) mechanically contact electrodes formed on the IC chip (20) and are electrically connected to the electrodes, so that the IC chip for mounting (10) is joined to the antenna patterns (44a), (44b) via the conductive wires (12a), (12b).

11 Claims, 5 Drawing Sheets

US 7,868,437 B2

MOUNTING STRUCTURE FOR IC TAG AND IC CHIP FOR MOUNTING

TECHNICAL FIELD

The present invention relates to a mounting structure for an IC tag formed by mounting an IC chip on an antenna substrate and to an IC chip for mounting for use with the same.

BACKGROUND ART

An IC tag is formed by mounting an IC chip on an antenna substrate on which an antenna for transmitting and receiving signals has been formed. Antenna substrates include substrates where an antenna pattern is formed on an electrically insulating film. The IC chip is mounted in a state where two electrodes provided on the chip are respectively electrically connected to both ends of the antenna pattern.

There are various methods for mounting an IC chip on an antenna substrate. As one example, an adhesive is applied onto the antenna substrate, the electrodes of the IC chip and connection terminals of the antenna pattern are aligned, and then heat and pressure are applied to join the IC chip to the antenna substrate and mount the IC chip with the antenna pattern and the IC chip electrically connected to one another.

Patent Document 1
Japanese Laid-Open Patent Publication No. 2003-6600

Patent Document 2
Japanese Laid-Open Patent Publication No. 2004-362190

DISCLOSURE OF THE INVENTION

IC tags are extremely small and are used for an extremely large number of applications. To make such large number of applications possible, IC tags need to be mass produced at low cost, and therefore more efficient methods of manufacturing are being investigated. In particular, since the IC chips used in modern IC tags are extremely small, there is the problem that the manufacturing process that manufactures IC tags by combining IC chips and antenna substrates is complex. Therefore, there is demand for a method that can mount an IC chip on an antenna substrate more easily.

Also, when heat and pressure are applied to an IC chip to connect the IC chip to an antenna substrate using adhesive, if the base material of the antenna substrate is a material with low heat resistance, such as a polyethylene film, there is the problem that the base material will melt when a high temperature is applied, which means that there has been the problem that during the manufacturing process, there are limits on the temperature to which the workpiece can be heated.

The present invention was conceived to solve the problems described above and it is an object of the present invention to provide a mounting structure for an IC tag that makes it easy to mount an IC chip onto an antenna substrate and can thereby reduce the manufacturing cost of an IC tag and to also provide an IC chip for mounting for use with such mounting structure.

To achieve the stated object, the present invention is constructed as described below.

That is, a mounting structure for an IC tag has an IC chip for mounting mounted so as to be electrically connected to an antenna pattern, wherein the IC chip for mounting is formed by winding conductive wires so as to encircle an outer surface of an IC chip between two opposite edges of the IC chip in a state where the conductive wires mechanically contact electrodes formed on the IC chip so as to be electrically connected to the electrodes, and the IC chip for mounting is joined to the antenna pattern via the conductive wires.

According to this mounting structure for an IC tag, the assembly process that mounts the IC chip for mounting on the antenna pattern is simplified, which makes it possible to reduce the manufacturing cost of IC tags.

Also, by disposing a pair of electrodes at opposite corner positions on the IC chip and attaching the conductive wires so as to be electrically connected to the respective electrodes, it is possible to further simplify the handling that mounts the IC chip for mounting.

In addition, the antenna pattern may be formed so as to cover a surface of an electrically insulating base film. Aside from being provided on an antenna substrate where an antenna pattern is formed on a base film, the antenna pattern may be formed as an antenna that uses only metal wires.

Also, as the IC chip for mounting used with the mounting structure for an IC tag described above, it is effective to use an IC chip for mounting formed by winding conductive wires so as to encircle an outer surface of an IC chip between two opposite edges of the IC chip in a state where the conductive wires mechanically contact electrodes formed on the IC chip so as to be electrically connected to the electrodes. Also, an IC chip where a pair of electrodes are disposed at opposite corner positions and the conductive wires are attached so as to be electrically connected to the respective electrodes is effective in simplifying the mounting operation on an antenna pattern and makes it possible to simplify the manufacturing of an IC chip for mounting.

Another mounting structure for an IC tag is constructed with an IC chip mounted so as to be electrically connected to an antenna pattern, wherein the IC chip is disposed in a planar configuration where the IC chip coincides with connection terminals of the antenna pattern for connecting the antenna pattern to the IC chip, and conductive wires are wound so as to encircle outer surfaces of both the IC chip and the antenna pattern in a state where the conductive wires mechanically contact electrodes formed on the IC chip and are electrically connected to the electrodes so that the IC chip and the antenna pattern are electrically connected via the conductive wires. According to this mounting structure for an IC tag, a heating process for thermally hardening an adhesive is no longer required, which makes it possible to simplify the manufacturing of IC tags.

The antenna pattern may be formed so as to cover a surface of an electrically insulating base film, the IC chip may be disposed so as to face the base film, and the conductive wires may be wound so as to encircle outer surfaces of both the IC chip and an antenna substrate composed of the antenna pattern and the base film.

BEST MODE FOR CARRYING OUT THE INVENTION

Preferred embodiments of a mounting structure for an IC tag according to the present invention and an IC chip for mounting for use with the same will now be described in detail with reference to the attached drawings.

First Embodiment

Figure 1:
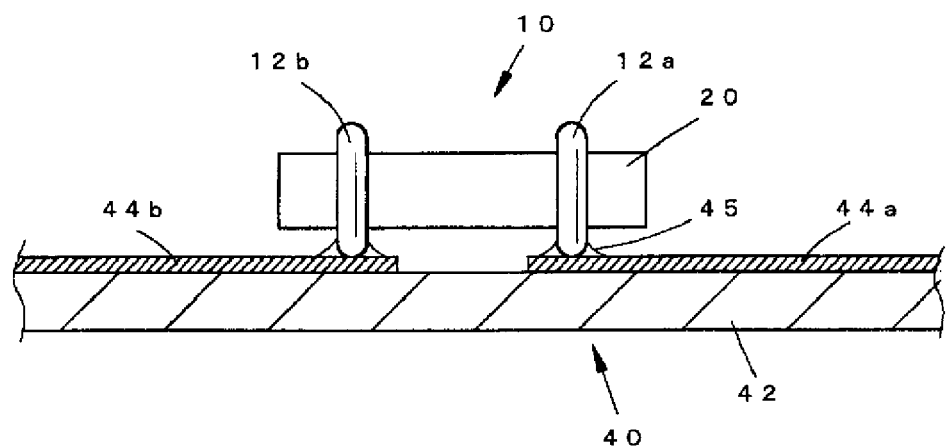
FIG. 1 is a cross-sectional view showing a first embodiment of a mounting structure for an IC tag.

FIG. 1 is a cross-sectional view showing a first embodiment of a mounting structure for an IC tag according to the present invention. The mounting structure for an IC tag according to the present embodiment is produced by mounting an IC chip for mounting 10 so as to be electrically connected to antenna patterns 44a, 44b formed on the surface of an electrically insulating base film 42. The IC chip for mounting 10 is formed by winding conductive wires 12a, 12b so that the conductive wires 12a, 12b are electrically connected to a pair of electrodes 20a, 20b formed on an IC chip 20 and so that the conductive wires 12a, 12b encircle the outer surface of the IC chip 20.

The IC chip for mounting 10 is mounted on an antenna substrate 40 by connecting the conductive wires 12a, 12b, which have been wound around and attached to the IC chip 20, to connection terminals of the antenna patterns 44a, 44b using solder 45. By doing so, the antenna patterns 44a, 44b are electrically connected to the IC chip 20.

Note that as the method of connecting the conductive wires 12a, 12b to the antenna patterns 44a, 44b, aside from a method of connecting that uses the solder 45, it is possible to use a method that uses a conductive material such as a conductive paste, a method that uses a conductive film such as an anisotropic conductive film, and the like. In this way, there are no particular limitations on the conductive joining material used when joining the conductive wires 12a, 12b of the IC chip for mounting 10 to the antenna patterns 44a, 44b.

Although the antenna substrate 40 illustrated in the drawings is a dipole antenna substrate on which a pair of antenna patterns 44a, 44b have been formed in a straight line on the surface of the base film 42, the IC chip for mounting 10 can be mounted in the same way onto an antenna substrate on which an antenna pattern is formed as a flat coil.

Figure 2:
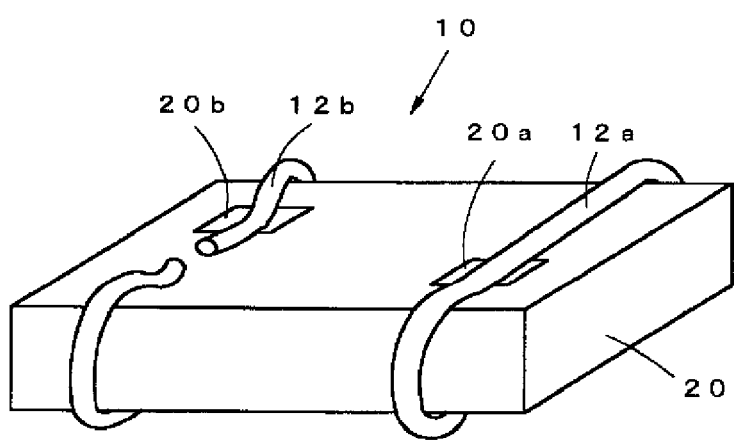
FIG. 2 is a perspective view showing a specific example of an IC chip for mounting.
Figure 3:
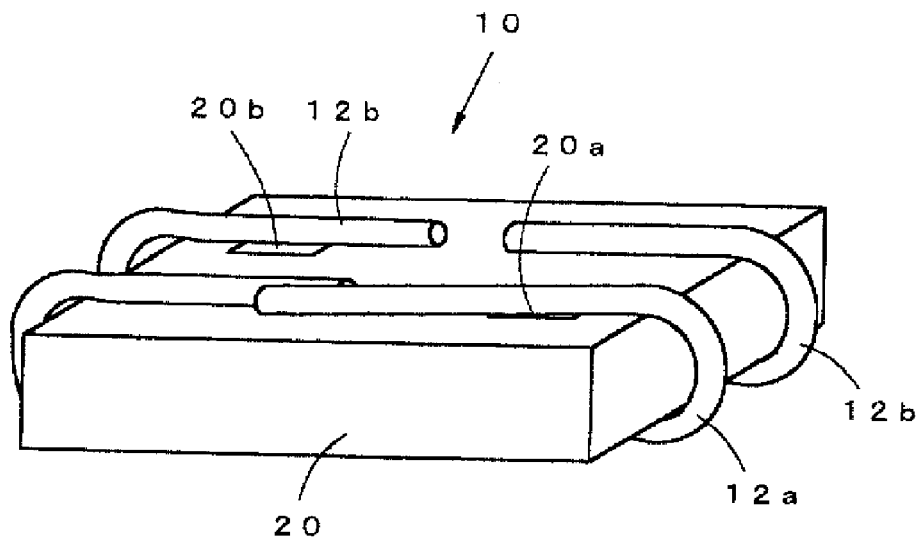
FIG. 3 is a perspective view of another specific example of an IC chip for mounting.

FIGS. 2 and 3 show examples of the IC chip 10 for mounting that is to be mounted on the antenna substrate 40. These IC chips for mounting 10 are each formed by attaching the conductive wires 12a, 12b so as to be wound around the IC chip 20 in a state where the conductive wires 12a, 12b are electrically connected to the electrodes 20a, 20b formed on the IC chip 20. The electrodes 20a, 20b are disposed at opposite corners on one surface of the IC chip 20. The conductive wires 12a, 12b respectively pass over the electrodes 20a, 20b and are attached so as to encircle the outer surface of the IC chip 20 along two opposite edges of the IC chip 20.

FIGS. 2 and 3 show states where the winding direction of the conductive wires 12a, 12b differs by 90° for the same IC chip 20. Since the IC chip 20 is formed so as to be square in planar form and the electrodes 20a, 20b are disposed at opposite corners, as shown in FIGS. 2 and 3 it is possible to wind the conductive wires 12a, 12b between opposite edges of the IC chip 20 as winding orientations where the conductive wires 12a, 12b will pass above the electrodes 20a, 20b. In either case, the conductive wires 12a, 12b are disposed so as to not cross one another and are attached to the IC chip 20 substantially in parallel with a gap therebetween.

With the IC chip for mounting 10, the electrodes 20a, 20b and the conductive wires 12a, 12b are electrically connected by the conductive wires 12a, 12b mechanically contacting the electrodes 20a, 20b of the IC chip 20. That is, when the conductive wires 12a, 12b are wound around the IC chip 10, the winding positions of the conductive wires 12a, 12b are set so as to overlap (i.e., intersect) the electrodes 20a, 20b, and when the conductive wires 12a, 12b are attached to the IC chip 20, the conductive wires 12a, 12b are placed in contact with the electrodes 20a, 20b and the conductive wires 12a, 12b are attached so that the contact between the conductive wires 12a, 12b and the electrodes 20a, 20b is maintained. By doing so, the conductive wires 12a, 12b become respectively connected to the electrodes 20a, 20b of the IC chip 20 along their entire lengths.

Fine metal wires such as copper wires or gold wires are used as the conductive wires 12a, 12b. Although there are no particular limitations on the material of the fine metal wires used as the conductive wires 12a, 12b, since the IC chip 20 used in the IC tag is extremely small with planar dimensions of around 1 mm by 1 mm, it is necessary to select fine metal wires of a thickness such that the conductive wires 12a, 12b do not contact one another and become short circuited when the conductive wires 12a, 12b are wound around the IC chip 20.

Figure 4:
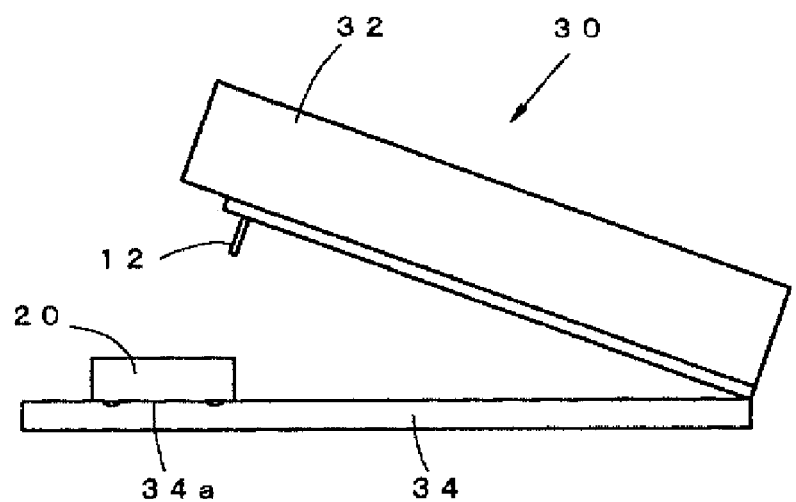
FIG. 4 is a schematic diagram of a winding device.

To form the IC chip for mounting 10 by mechanically winding the conductive wires 12a, 12b around the IC chip 20, it is possible to use a stapler winding device 30 such as that shown in FIG. 4. The winding device 30 includes a pressing portion 32, which is equipped with a storage portion that stores U-shaped conductive wires 12 and a pressing arm that presses out the conductive wires 12 one at a time, and a support 34 that supports the IC chip 20. A setting portion 34a that sets and positions the IC chip 20 is provided on the support 34 and a guide groove that guides the conductive wire 12 pressed out by the pressing portion 32 so that the conductive wire 12 becomes wound around the outer surface of the IC chip 20 is provided on the setting portion 34a.

An operation that uses the winding device 30 to wind a conductive wire 12 around the IC chip 20 is carried out as follows. The IC chip 20 is set on the setting portion 34a of the support 34 with the pressing portion 32 located at an opened position and then the pressing portion 32 is pressed down so that the IC chip 20 becomes sandwiched between the pressing portion 32 and the support 34. Due to the sandwiching force of the pressing portion 32 and the support 34, the pressing arm of the pressing portion 32 presses out a conductive wire 12. The winding position of the conductive wire 12 is guided by the guide groove provided in the setting portion 34a so that the conductive wire 12 is wound below the IC chip 20. In this way, the conductive wire 12 becomes wound around the outer surface of the IC chip 20.

The setting portion 34a provided on the support 34 is set so that in a state where the IC chip 20 has been set on the setting portion 34a, the position at which the conductive wire 12 is pressed out from the pressing portion 32 matches one of the positions of the electrodes 20a, 20b of the IC chip 20. In this way, by carrying out an operation that sets the IC chip 20 on the setting portion 34a and winds a conductive wire 12, the conductive wire 12 will pass over one of the electrodes 20a, 20b of the IC chip 20 and become electrically connected to such electrode.

After a conductive wire 12 has been wound onto one of the electrodes 20a, 20b of the IC chip 20, it is possible to set the IC chip 20 on the setting portion 34a with the opposite orientation to the orientation shown in FIG. 4 and to carry out a winding operation in the same way so that the conductive wire 12 is wound around the IC chip 20 in a state where the conductive wire 12 is electrically connected to the other electrode. Since the electrodes 20a, 20b of the IC chip 20 are disposed at opposite corners, regardless of the orientation used to set the IC chip 20 when the IC chip 20 is set on the setting portion 34a, it is possible to wind the conductive wires 12 in a state where the electrodes 20a, 20b and the conductive wires 12 are electrically connected. When the IC chip 20 is set on the support 34, the surface of the IC chip 20 on which the electrodes 20a, 20b are formed may face upward or may face downward. Since the conductive wires 12 are wound around so as to encircle the IC chip 20, the electrodes 20a, 20b and the conductive wires 12 will become electrically connected regardless of whether the electrodes 20a, 20b face upward or face downward.

FIG. 2 shows an example where the conductive wires 12a, 12b have been wound around the IC chip 20 so that one of the conductive wires (the conductive wire 12a) has been wound facing downward and the other of the conductive wires (the conductive wire 12b) has been wound facing upward. FIG. 3 shows an example where the conductive wires 12a, 12b have been wound facing upward and the ends of one of the conductive wires (the conductive wire 12a) overlap one another. In this way, in a state where the conductive wires 12a, 12b have been wound around the IC chip 20, both ends of a conductive wire may be slightly apart or may slightly overlap one another.

As the apparatus that attaches the conductive wire 12 so as to be wound around the outer surface of the IC chip 20, aside from using a winding device 30 such as that shown in FIG. 4, it is also possible to use a machining mold used to bend a thin metal wire. When the conductive wires 12 are wound around the IC chip 20, it is also possible to attach the conductive wires 12a, 12b so as to be electrically connected to the two electrodes 20a, 20b by winding two conductive wires 12 around the IC chip 20 in a single winding operation.

In this way, with the IC chip 20 used for the IC chip for mounting 10 according to the present embodiment, it is possible to form the IC chip for mounting 10 by setting the IC chip 20 on the support 34 of the winding device 30 or a mold for winding the conductive wires without having to distinguish the orientation or the front/rear of the IC chip 20, resulting in the merit that it is easy to manufacture the IC chip for mounting 10. Since it is possible to form the IC chip for mounting 10 without considering the orientation of the IC chip 20, it is easy to handle the extremely small IC chips 20 used in IC tags, which results in improved workability.

Note that the method of forming an IC chip for mounting 10 by winding the conductive wires 12 around the IC chip 20 as described earlier is not limited to an arrangement where the electrodes 20a, 20b are disposed at opposite corners on one surface of the IC chip 20 as shown in FIGS. 2 and 3. The electrodes 20a, 20b may be disposed at freely chosen positions and as examples, the electrodes 20a, 20b may be formed disposed at opposite corners but on different surfaces of the IC chip 20 or the electrodes 20a, 20b may be disposed at facing positions between two opposite edges on one surface of the IC chip 20.

Note that by forming pads, on which the electrodes 20a, 20b of the IC chip 20 will be formed, so as to slightly protrude from the surface of the IC chip 20, it is possible to achieve reliable contact between the conductive wires 12a, 12b and the electrodes 20a, 20b and therefore to achieve reliable electrical connections between the electrodes 20a, 20b and the conductive wires 12a, 12b. After the conductive wires 12a, 12b have been wound around the IC chip 20, it is also possible to apply conductive material such as conductive paste to the contacting parts of the electrodes 20a, 20b and the conductive wires 12a, 12b to join the electrodes 20a, 20b and the conductive wires 12a, 12b together and thereby further increase the reliability of the electrical connections between such components.

FIG. 5 shows a method of mounting the IC chip for mounting 10 on the antenna substrate 40. As a comparative example, FIG. 5A shows a conventional mounting structure for an IC tag for producing an IC tag by mounting an IC chip 20 on an antenna substrate 40. FIGS. 5B to 5D show mounting structures for IC tags according to the present invention where the IC chip for mounting 10 described earlier has been mounted on an antenna substrate 40.

Figure 5A:
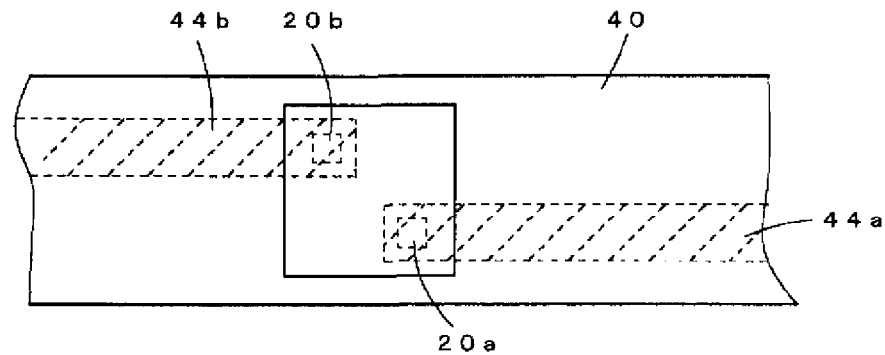
FIGS. 5A to 5D are diagrams useful in explaining examples where an IC chip for mounting is mounted on an antenna substrate.

As shown in FIG. 5A, with the conventional mounting structure for an IC tag, the electrodes 20a, 20b are oriented so as to face the antenna patterns 44a, 44b formed on the antenna substrate 40 and the electrodes 20a, 20b are aligned with and joined to the terminals. That is, by flip-chip bonding the IC chip 20, the positions of the electrodes 20a, 20b and the terminals of the antenna patterns 44a, 44b are aligned and joined together.

Figure 5B:
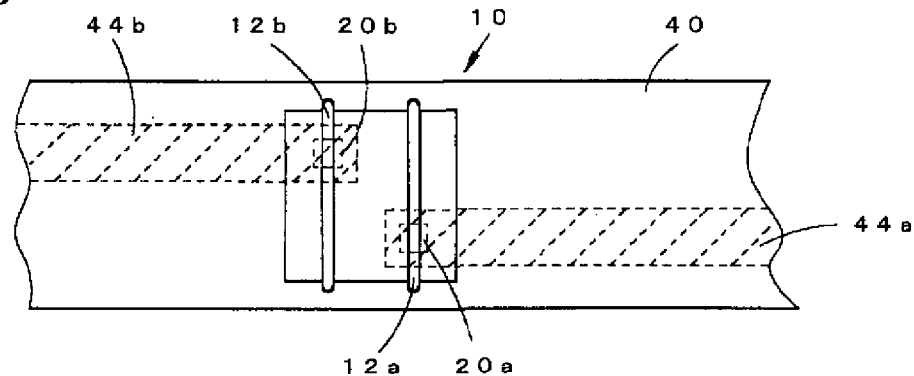
Figure 5C:
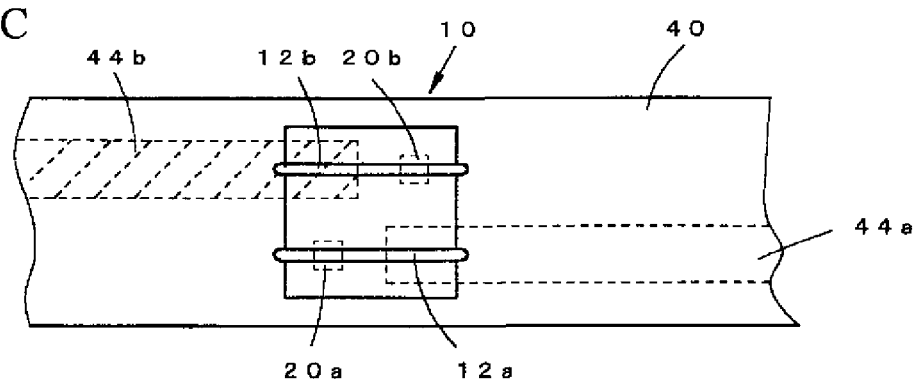
Figure 5D:
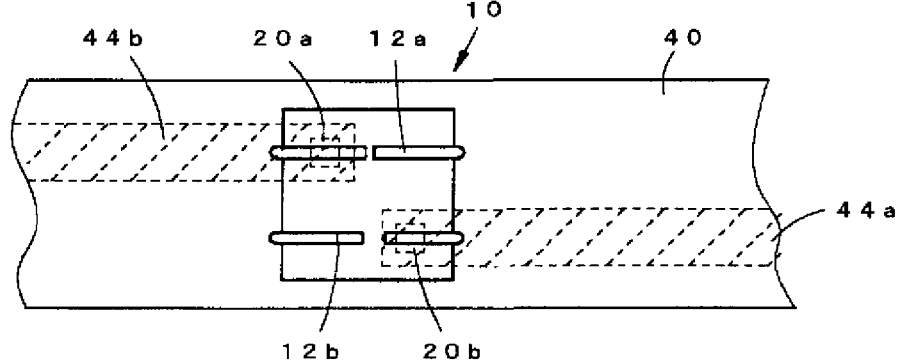

On the other hand, FIGS. 5B and 5C show states where the IC chip for mounting 10 has been mounted with a surface of the IC chip 20 on which the electrodes 20a, 20b are formed (i.e., the front surface of the IC chip 20) facing the antenna substrate 40 and FIG. 5D shows a state where the IC chip for mounting 10 has been mounted with the rear surface of the IC chip 20 facing the antenna substrate 40. As shown in FIGS. 5B to 5D, according to the IC chip for mounting 10 according to the present embodiment, the conductive wires 12a, 12b and the electrodes 20a, 20b of the IC chip 20 are joined together and the IC chip 20 and the antenna patterns 44a, 44b become electrically connected via the conductive wires 12a, 12b. Accordingly, when the IC chip for mounting 10 is mounted on the antenna substrate 40, it is possible to carry out mounting and to electrically connect the antenna patterns 44a, 44b and the IC chip 20 without having to distinguish the orientation of the IC chip for mounting 10 (i.e., whether the IC chip for mounting 10 faces horizontally or vertically) or to distinguish between the front and rear of the IC chip for mounting 10. The reason a slight separation is tolerated between both ends of the conductive wires 12a, 12b when the conductive wires 12a, 12b are wound around the IC chip 20 is that as shown in FIGS. 5B to 5D, it is possible in reality to carry out mounting with no particular consideration to the orientation of the IC chip for mounting 10 even when there is a slight separation between both ends of the conductive wires 12a, 12b. That is, in this specification, the expression "the conductive wires 12a, 12b are wound so as to encircle the outer surface of the IC chip 20" means that the conductive wires 12a, 12b are wound so as to sufficiently satisfy a condition that mounting can be carried out without having to consider the mounting orientation of the IC chip for mounting 10.

As described above, when the IC chip for mounting 10 in the present embodiment is mounted on the antenna substrate 40, it is only necessary to align the conductive wires 12a, 12b, and the antenna patterns 44a, 44b and the orientation of the IC chip for mounting 10 can be freely selected. This means it is possible to carry out the assembly process of an IC tag extremely easily and efficiently. By doing so, it is possible to easily automate the mounting operation of the IC chip for mounting 10.

Note that although an example where the IC chip for mounting 10 is mounted on the antenna substrate 40 has been described in the present embodiment, in place of the antenna substrate 40, it is also possible to join the IC chip for mounting 10 to an antenna composed of only metal wires to produce an IC tag. In this case, the antenna composed of metal wires corresponds to the antenna patterns.

Second Embodiment

Figure 6:
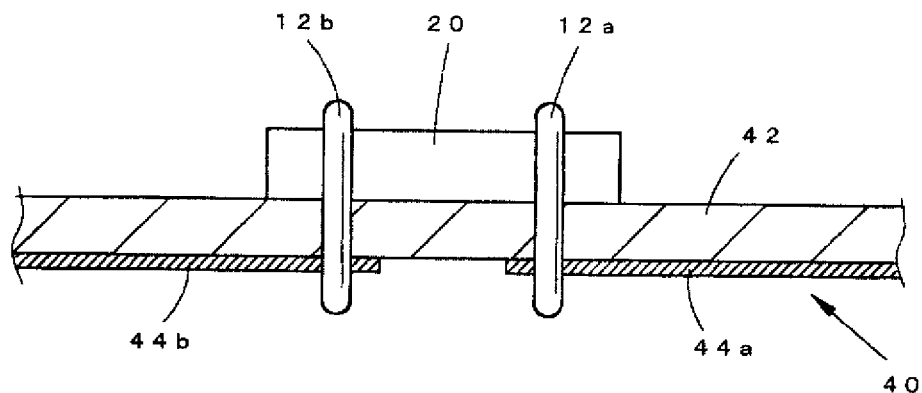
FIG. 6 is a cross-sectional view showing a second embodiment of a mounting structure for an IC tag.

FIG. 6 is a cross-sectional view of a second embodiment of a mounting structure for an IC tag according to the present invention. With the mounting structure for an IC tag according to the present embodiment, the IC chip 20 is set so as to be aligned with connection terminals of the antenna patterns 44a, 44b formed on the antenna substrate 40 and the conductive wires 12a, 12b are wound so as to surround the outer surfaces of both the IC chip 20 and the antenna substrate 40 and thereby mount the IC chip 20 on the antenna substrate 40.

Figure 7:
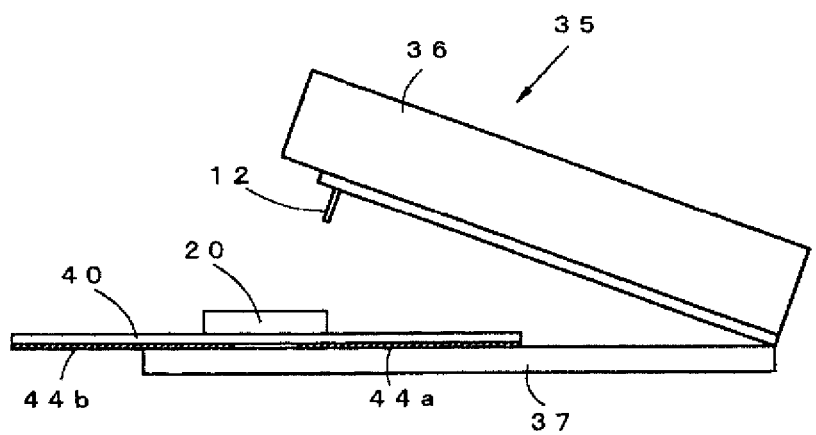
FIG. 7 is a schematic diagram of a winding device.

FIG. 7 shows a winding appliance 35 that winds the conductive wire 12 around both the IC chip 20 and the antenna substrate 40 and a method of winding a conductive wire 12 around the IC chip 20 and the antenna substrate 40 using the winding appliance 35. The winding appliance 35 is formed in the same way as the stapler winding device 30 used when forming the IC chip for mounting 10 described earlier and includes a pressing portion 36 that houses U-shaped conductive wires 12 and a support 37 that supports the antenna substrate 40 and the IC chip 20.

An operation that winds a conductive wire 12 around both the IC chip 20 and the antenna substrate 40 is carried out by setting the antenna substrate 40 and the IC chip 20 on the support 37, applying pressure to the IC chip 20 and the antenna substrate 40 using the pressing portion 36, pressing out the conductive wire 12 from the pressing portion 36 using the sandwiching force that acts between the pressing portion 36 and the support 37, and having the conductive wire 12 wound around the bottom of the antenna substrate 40 so that the conductive wire 12 is wound around the outer surfaces of the IC chip 20 and the antenna substrate 40.

FIG. 8 shows a state where the operation that winds a conductive wire 12 around both the IC chip 20 and the antenna substrate 40 is viewed from above the antenna substrate 40.

Figure 8A:
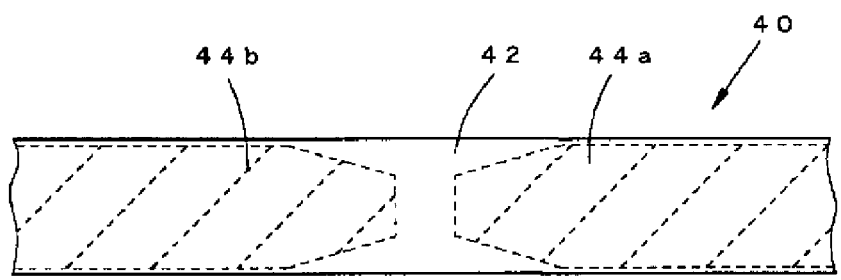
FIGS. 8A to 8C are diagrams useful in explaining a process that mounts an IC chip on an antenna substrate.

FIG. 8A is an enlargement of the periphery of a part of the antenna substrate 40 where the IC chip 20 is mounted. The antenna substrate 40 is a dipole antenna substrate on which a pair of antenna patterns 44a, 44b have been formed in a straight line. With the antenna substrate 40, the base film 42 is formed with substantially the same width as the antenna patterns 44a, 44b and the antenna patterns 44a, 44b are formed on the lower surface of the base film 42 (the opposite surface to the surface on which the IC chip 20 will be mounted).

Figure 8B:
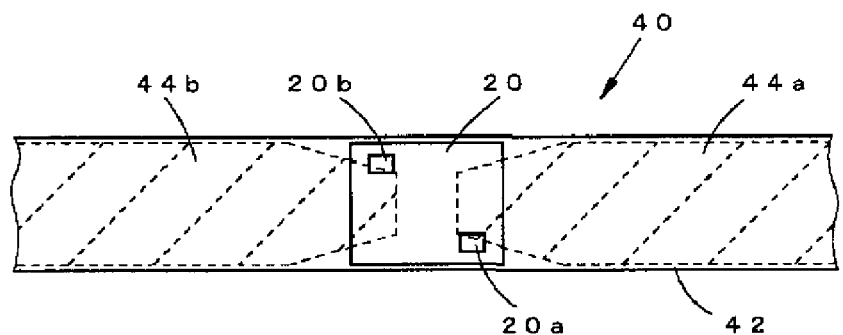

FIG. 8B shows a state where the IC chip 20 has been positioned and set on the antenna substrate 40. The IC chip 20 is set on the antenna substrate 40 so that the surface on which the electrodes 20a, 20b are formed is on the opposite side of the IC chip 20 to the side that faces the base film 42, that is, the IC chip 20 is set so that the electrodes 20a, 20b are exposed to the outside.

Figure 8C:
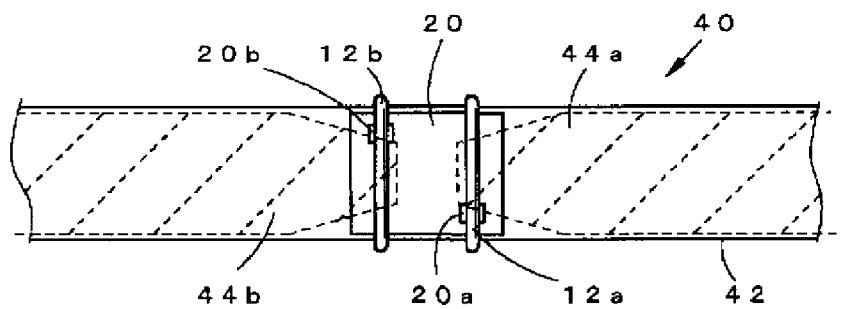

FIG. 8C shows a state where the conductive wires 12a, 12b have been wound around the IC chip 20 and the antenna substrate 40. The conductive wire 12a is wound so as to encircle a position between opposite edges of the IC chip 20 and the antenna substrate 40 in the width direction of the antenna substrate 40 so as to pass above the electrode 20a provided on the IC chip 20.

Like the IC chip for mounting 10 of the embodiment described earlier, the electrical connections between the conductive wires 12a, 12b and the electrodes 20a, 20b of the IC chip 20 are achieved by mechanical contact between the conductive wires 12a, 12b and the electrodes 20a, 20b. The electrical connections between the conductive wires 12a, 12b and the antenna patterns 44a, 44b of the antenna substrate 40 are also achieved by the conductive wires 12a, 12b that have been wound around the bottom of the antenna substrate 40 pressing (i.e., making contact with) the connection terminals of the antenna patterns 44a, 44b. Note that the connection terminals of the antenna patterns 44a, 44b are formed on the base film 42 so that when the conductive wires 12a, 12b have been wound at positions that overlap (intersect) the electrodes 20a, 20b of the IC chip 20, the winding positions (passing positions) of the conductive wires 12a, 12b and the connection terminals intersect.

In this way, according to the mounting structure for an IC tag according to the present embodiment, the antenna patterns 44a, 44b formed on the antenna substrate 40 and the IC chip 20 are electrically connected via the conductive wires 12a, 12b.

The method of supporting the IC chip 20 on the antenna substrate 40 via an operation that mechanically winds the conductive wires 12a, 12b does not require a process of thermally bonding the IC chip 20 to the antenna substrate 40 using an adhesive, thereby solving the problem of the base film 42 of the antenna substrate 40 melting due to the application of heat. This results in the benefit that it is easy to assemble an IC tag.

Note that although an example where the IC chip 20 is mounted on the dipole antenna substrate 40 has been described in the above embodiment, it is also possible to form the antenna patterns on the antenna substrate 40 in appropriate patterns. With the present embodiment also, instead of mounting the IC chip 20 on the antenna substrate 40, it is possible to mount the IC chip 20 on an antenna composed of only metal wires. In this case, the antenna composed of metal wires corresponds to the antenna patterns.

What is claimed is:

1. A mounting structure for an IC tag where an IC chip including a first electrode and a second electrode is mounted on a base so as to be electrically connected to an antenna pattern formed on the base, the antenna pattern including a first terminal and a second terminal,
   wherein a first conductive wire is wound around a periphery of the IC chip to contact the first electrode of the IC chip and the first terminal of the antenna pattern, and
   a second conductive wire is wound around the periphery of the IC chip to contact the second electrode of the IC chip and the second terminal of the antenna pattern.

2. A mounting structure for an IC tag according to claim 1, wherein the first electrode and the second electrode of the IC chip are disposed at opposite corner positions on the IC chip.

3. A mounting structure for an IC tag according to claim 1, wherein the antenna pattern is formed so as to cover a surface of an electrically insulating base film.

4. An IC chip for mounting used with a mounting structure for an IC tag according to claim 1,
   wherein the first conductive wire directly contacts the first electrode, and
   the second conductive wire directly contacts the second electrode.

5. An IC chip for mounting according to claim 4, wherein the first electrode and the second electrode are disposed at opposite corner positions on the IC chip.

6. A mounting structure for an IC tag where an IC chip including a first electrode and a second electrode is mounted on a base so as to be electrically connected to an antenna pattern formed on the base, the antenna pattern including a first terminal and a second terminal,
- wherein the IC chip is disposed on a first surface of the base;
- the antenna pattern is formed on a second surface of the base;
- the IC chip overlaps with the first terminal and the second terminal of the antenna pattern;
- a first conductive wire and a second conductive wire are respectively wound around the surface of the IC chip where the first electrode and the second electrode formed and second surface of the base;
- the first conductive wire contacts the first electrode of the IC chip and the first terminal of the antenna pattern; and
- the second conductive wire contacts the second electrode of the IC chip and the second terminal of the antenna pattern.

7. A mounting structure for an IC tag according to claim 6, wherein
the base is formed of an insulative film.

8. An IC tag comprising:
- a base;
- an IC chip disposed on the base, and including a first electrode and a second electrode formed on a surface thereof;
- a first conductive wire wound around a periphery of the IC chip to contact the first electrode of the IC chip;
- a second conductive wire wound around the periphery of the IC chip to contact the second electrode of the IC chip;
- an antenna pattern formed on the base, the antenna pattern including a first terminal and a second terminal,
- wherein the first conductive wire contacts the first terminal of the antenna pattern, and the second conductive wire contacts the second terminal of the antenna pattern.

9. The IC tag according to claim 8, wherein
- the first electrode and the second electrode are formed on a first surface of the IC chip, and
- the IC chip is disposed on the base in a manner the second surface of the IC chip is facing the base.

10. An IC chip comprising:
- a first electrode disposed on a surface of the IC chip;
- a second electrode disposed on the surface of the IC chip;
- a first conductive wire wound around a periphery of the IC chip to contact the first electrode of the IC chip; and
- a second conductive wire wound around the periphery of the IC chip to contact the second electrode of the IC chip,
- wherein the first conductive wire is configured to contact a first terminal of an antenna pattern formed on a base, and
- the second conductive wire is configured to contact a second terminal of the antenna pattern formed on the base.

11. An IC tag comprising:
- a base;
- an IC chip disposed on a first surface of the base, and including a first electrode and a second electrode formed on a surface thereof;
- an antenna pattern formed on a second surface of the base, the antenna pattern including a first terminal and a second terminal, the IC chip is overlapping with the first terminal and the second terminal of the antenna pattern; and
- a first conductive wire and a second conductive wire respectively wound around the surface of the IC chip where the first electrode and the second electrode formed and second surface of the base,
- wherein the first conductive wire contacts the first electrode of the IC chip and the first terminal of the antenna pattern, and
- the second conductive wire contacts the second electrode of the IC chip and the second terminal of the antenna pattern.

* * * * *